United States Patent [19]
Stockton

[11] Patent Number: 5,179,540
[45] Date of Patent: Jan. 12, 1993

[54] PROGRAMMABLE CHIP ENABLE LOGIC FUNCTION

[75] Inventor: David W. Stockton, Palm Bay, Fla.

[73] Assignee: Harris Corporation, Melbourne, Fla.

[21] Appl. No.: 691,546

[22] Filed: Apr. 25, 1991

Related U.S. Application Data

[63] Continuation of Ser. No. 796,215, Nov. 8, 1985, abandoned.

[51] Int. Cl.[5] .............................................. G11C 17/00
[52] U.S. Cl. .................................... 365/225.7; 365/96
[58] Field of Search ...................... 365/189.05, 189.08, 365/225.7, 96, 191

[56] References Cited

U.S. PATENT DOCUMENTS 4,157,480  6/1979  Edwards ........................... 365/96 X
4,590,388  5/1986  Clemons et al. ................. 307/202.1
4,718,042  1/1988  Moll et al. ............................ 365/201

Primary Examiner—Joseph A. Popek
Attorney, Agent, or Firm—Barnes & Thornburg

[57] ABSTRACT

A programmable chip enable provides for enabling or disabling an integrated circuit in response to a selected one of a plurality of logic signals. In a specific application, the programmable enable function is used in combination with a plurality of field programmable memory devices. The enable functions of the respective devices are programmed to prevent simultaneous enablement of the memory devices which have their outputs connected together.

21 Claims, 2 Drawing Sheets

PROGRAMMABLE CHIP ENABLE LOGIC FUNCTION

This is a continuation of application Ser. No. 06/796,215, filed Nov. 8, 1985, now abandoned.

BACKGROUND AND SUMMARY OF THE INVENTION

This invention relates generally to chip enable functions used on integrated circuits and, more specifically, to chip enable functions on field programmable devices.

The use of enable inputs on integrated circuit devices is well known. These inputs are used to enable or disable a device or function in accordance with specific design requirements or specifications.

A specific example of the use of a chip enable is seen in circuits which require the outputs of several memory devices to be connected together. Such circuits require that the outputs of the subject memory devices be either open collector outputs or "three state" outputs. If open collector outputs are used, the outputs from different devices can be "wire OR'd" together. However, to attain high switching speeds, an active output pull-up is usually preferred. This necessitates the use of "three state" outputs. To connect these outputs together further requires the use of one or more output enable, chip enable, or gate pins on the respective devices. These inputs usually require external (i.e., off-chip) logic circuitry to supply the appropriate enabling or disabling signal. For example, if the outputs of two devices that each have a single active low enable are to be connected, an inverter is used to provide opposite logic state signals to the enable pins on the respective devices to ensure that they are not enabled at the same time. In more complex arrangements, the external logic circuitry required to drive the enable inputs of a plurality of devices can become proportionately more complicated than the single inverter in the example described above. Implementation of this external circuitry requires additional board space and adds to the complexity of the board wiring. Accordingly, there exists a need to eliminate or reduce the external circuitry required to successfully connect devices such as those described above.

It is an object of the present invention to provide a means by which the external (off-chip) circuitry on application type circuit boards can be eliminated or simplified.

Another object of the present invention is to provide a means by which the layout of application type printed circuit boards can be simplified.

Yet another object of the present invention is to provide an enable function for an integrated logic array which has improved operating speed characteristics.

These and other objects are attained in an integrated circuit device which includes a programmable enable function. More specifically, the present invention comprises a programmable chip enable for an integrated circuit which includes an input on the device for receiving a logic level enable signal, circuitry for producing an enabling signal in response to the logic level signal at the input, and means for programming the circuitry to respond to a selected one of a plurality of logic level signals. A preferred application of this invention is in field programmable memory devices which have one or more memory outputs connected together.

A programmable enable function allows a particular device to be customized at the time of application and effectively replaces the additional circuitry required in applications such as that described above. In the specific example discussed, wherein two devices have single enables driven by an inverted and a non-inverted logic output, a programmable enable function would eliminate the external circuitry (i.e., the inverter) altogether. One device would have its enable programmed to be active low and the other device would have its enable programmed to be active high. Thus, the enables can be connected to a single line with assurance that the two devices will not operate simultaneously.

Other objects and advantages of the prevent invention will be more apparent from the following detailed description of the preferred embodiments depicted in the drawings.

DETAILED DESCRIPTION OF THE DRAWINGS

Figure 1:
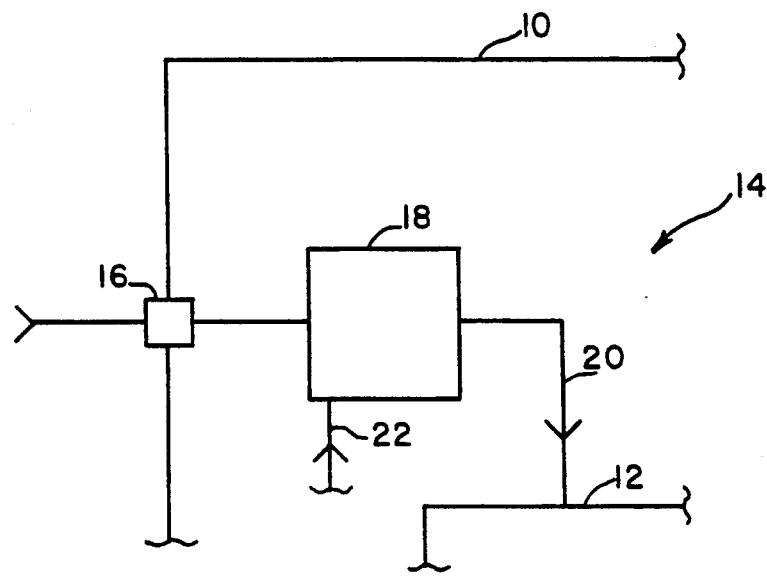
FIG. 1 shows a schematic representation of an integrated circuit device constructed in accordance with the present invention.

FIG. 1 shows a schematic representation of a portion of an integrated circuit device 10 which includes a circuit 12, which is to be enabled, and a corresponding enabling circuit 14 constructed in accordance with the present invention. Enabling circuit 14 includes input enable pin 16 and a programming arrangement which is schematically represented by block 18 in FIG. 1. The output of block 18 is connected, via line 20, to circuit 12 to provide an enabling signal to the circuit. By way of specific example only, line 20 may be connected to output buffers of circuit 12, as well as to other components and locations, as desired. Block 18 also receives a programming control signal, via line 22, as an additional control input to activate the programming of block 18, which determines whether integrated circuit device 10 will be enabled by a high or low logic level signal at pin 16. The program control signal may be supplied from a source external to the integrated circuit device or, alternatively, may be generated internally by other circuits on the device.

The circuit of FIG. 1 operates as follows. Depending upon the specific design criteria, the circuit of block 18 (which is described in detail with reference to FIG. 2 below) is programmed to respond to one of a plurality of logic level signals present at input enable pin 16. For example, the circuit may be programmed to provide an enabling signal to circuit 12 when a high logic level signal is present at input pin 16. Alternatively, the circuit may be programmed to provide the enabling signal when a low logic level signal is present at input pin 16. A preferred technique for implementing the programmable enable function is discussed below with reference to FIG. 2 and a preferred application for this circuit is illustrated in FIG. 3.

Figure 2:
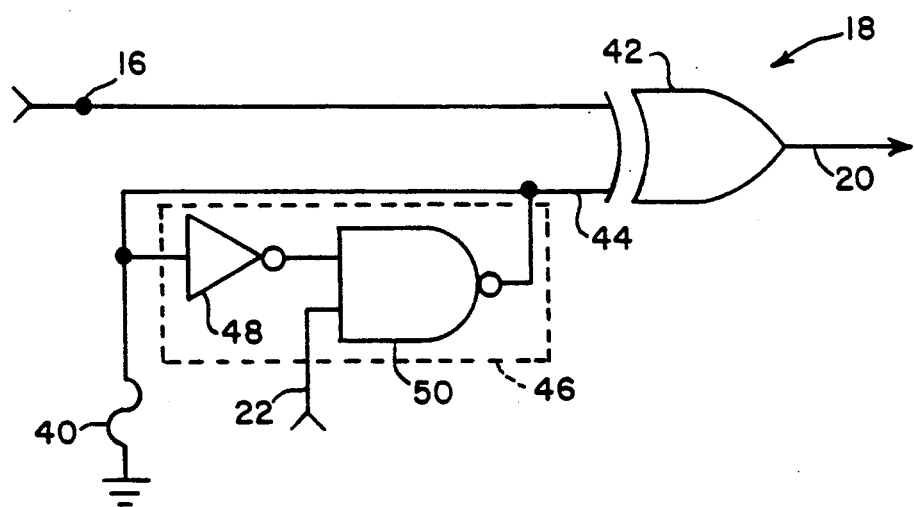
FIG. 2 shows a logic diagram of a programmable enable function in accordance with the present invention.
Figure 3:
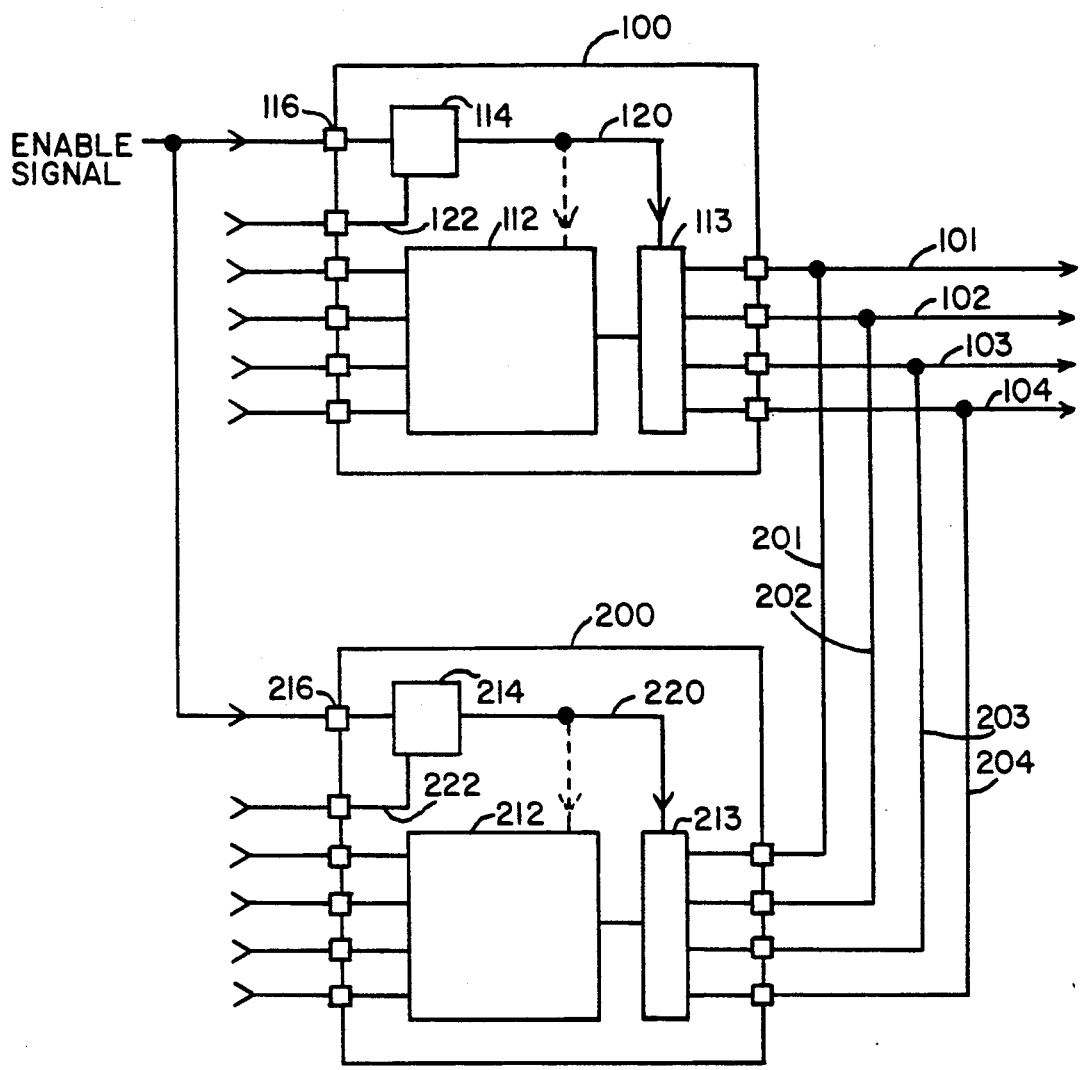
FIG. 3 shows a schematic representation of a preferred application of the present invention in field programmable memory devices having one or more memory outputs connected together.

FIG. 2 shows a logic diagram of a preferred embodiment of the programming arrangement represented by block 18 in FIG. 1. The circuit includes an Exclusive OR gate 42 having one input connected to enable input pin 16 and another input connected to receive a control signal, via line 44, as detailed in the following paragraph. The output of Exclusive OR gate 42 is connected to line 20 and serves as the output of Block 18.

In this preferred embodiment of the invention, line 44 is connected to a reference potential (i.e., a low logic level) by a programmable element 40 which is depicted in FIG. 2 as a fuse. Associated with programmable element 40 is a programming circuit 46 which is connected to line 44 and to the programming control signal, via line 22. Programming circuit 46 includes an inverter 48 having an input connected to one end of programmable element 40, and an output connected to an input of NAND gate 50. The other input of NAND gate 50 is connected to line 22, and the output of gate 50 is connected to line 44.

The circuit of FIG. 2, which is easily implemented in a variety of technologies, operates as follows. In the condition illustrated in FIG. 2 (i.e., with programmable element 40 intact), line 44 and the corresponding input to Exclusive OR gate 42 are connected to a logic low level. As a result, Exclusive OR gate 42 acts as a non-inverting buffer which transfers the logic signal present at enable input pin 16 directly to output line 20. Under these conditions, the input to inverter 48 is also held at a logic low level, resulting in the presence of a logic high level at the corresponding input to NAND gate 50. The presence of a logic high level on line 22 maintains the output of NAND gate 50 at a logic low level, as illustrated. To change the state of the programmable element, line 22 is brought low resulting in a high logic level signal at the output of NAND gate 50. This results in current flow through programmable element 40 and causes element 40 to disconnect line 44 from the logic low level reference. As a result, a logic high is present at line 44 and the corresponding input to Exclusive OR gate 42, causing gate 42 to act as an inverting buffer when transferring the logic state applied to enable pin 16 to output line 20.

A preferred application of the programmable enable circuit of the present invention is shown in FIG. 3. In this arrangement, field programmable memory devices 100 and 200 have outputs 101-104 and 201-204 which are connected together as shown in FIG. 3. Each memory device has an array of memory elements 112 and 212 which are connected to the outputs by respective output buffers 113 and 213. Programmable enable circuits 114 and 214, as described with reference to FIGS. 1 and 2 above, are provided in each of memory devices 100 and 200. Outputs 120 and 220 of circuits 114 and 214 provide enable signals to output buffers 113 and 213, respectively. This enable signal may also be provided to other circuits in the device, as illustrated by dashed lines in FIG. 3. Enable input pins 116 and 216 are connected to a single enable signal. Programmable enable circuit 114 is programmed, for example, to produce an enable signal at output 120 when the enable signal at input 116 is active high. Programmable enable circuit 214 is correspondingly programmed to produce an enable signal at output 220 when the enable signal at input 216 is active low. This assures that outputs 101-104 and 201-204 will not be enabled simultaneously. In the arrangement illustrated in FIG. 3, a programming control signal is applied to lines 122 and 222 from an external source connected to an input pin on the respective devices.

Although the invention has been described and illustrated in detail by reference to specific embodiments, it is to be clearly understood that this description is to be taken by way of illustration only and not by way of limitation. Although the programmable enable function of the present invention is particularly advantageous when used in combination with field programmable memory devices as described above, applications in other types of integrated circuits are anticipated. Accordingly, the spirit and scope of the invention are to be limited only by the terms of the appended claims.

What is claimed is:

1. An integrated circuit having a programmable chip enable, comprising:
   at least one data input;
   at least one data output;
   an enable input for receiving at least one of a relatively high logic level signal and a relatively low logic level signal from an external source; and
   programmable circuit means, connected to said enable input, for enabling the integrated circuit to produce an output signal at said data output in response to a selected one of said relatively high and said relatively low logic level signals received at said enable input, and for disabling the integrated circuit to prevent an output signal from being produced at the data output in response to the other of said signals received at the enable input.

2. An integrated circuit according to claim 1, wherein said programmable circuit means comprises a logic element having a first input connected to said input for receiving logic level signals from said external source, a second input connected to a reference voltage by a programmable element, and means for programming said programmable element.

3. An integrated circuit according to claim 2, wherein said programmable element is a fuse.

4. An integrated circuit according to claim 2, wherein said means for programming said programmable element comprises an inverter having an input connected to the programmable element and having an output, and a NAND gate having a first input connected to the output of the inverter, a second input connected to a programming control signal source, and an output connected to the programmable element.

5. An integrated circuit according to claim 2, wherein said logic element is an Exclusive OR gate.

6. A field programmable memory device having a programmable chip enable, comprising:
   an array of memory elements;
   a plurality of inputs and outputs for accessing the memory elements;
   an enable input for receiving at least one of a relatively high logic level signal and a relatively low logic level signal from an external source; and
   programmable circuit means, connected to said enable input for receiving logic level signals, for enabling the memory device in response to a selected one of said relatively high and said relatively low logic level signals received at said enable input;
   wherein said programmable circuit means has a programming input, connected to a programming control signal source, for receiving a programming control signal to program the programmable circuit means to respond to said selected one of said relatively high and low logic level signals received at said enable input.

7. A field programmable memory device according to claim 6, wherein said programmable circuit means comprises a logic element having a first input connected to said input for receiving logic level signals from an external source, a second input connected to a reference voltage by a programmable element, and means for programming said programmable element.

8. A field programmable memory device according to claim 7, wherein said programmable element is a fuse.

9. A field programmable memory device according to claim 7, wherein said means for programming said programmable element comprises an inverter having an input connected to the programmable element and having an output, and a NAND gate having a first input connected to the output of the inverter, a second input connected to the programming input, and an output connected to the programmable element.

10. A field programmable memory device according to claim 7, wherein said logic element is an Exclusive OR gate.

11. An integrated circuit device, comprising:
a circuit having at least one input and at least one output, and having an enable input;
an enabling circuit having an input connected to an input pin of the integrated circuit device for receiving at least one of a relatively high logic level signal and a relatively low logic level signal from an external source, and having an output connected to the enable input of the circuit, and having a programming input connected to a programming control signal source; and
programmable means in said enabling circuit for causing the enabling circuit to provide an enabling signal to the enabling input of the circuit in response to a selected one of said relatively high and said relatively low logic level signals.

12. An integrated circuit device according to claim 11, wherein said programmable means comprises a logic element having a first input connected to the input pin of the integrated circuit device, a second input connected to a reference voltage by a programmable element, and means for programming said programmable element.

13. An integrated circuit device according to claim 12, wherein said means for programming said programmable element comprises an inverter having an input connected to the programmable element and having an output, and a NAND gate having a first input connected to the output of the inverter, a second input connected to the programming input, and an output connected to the programmable element.

14. An integrated circuit device according to claim 12, wherein said logic element is an Exclusive OR gate.

15. A field programmable memory device, comprising:
an array of memory elements;
a plurality of inputs and outputs for accessing the memory elements;
an enable input for receiving a signal which enables the memory device;
an enabling circuit having an input connected to an input pin of the memory device for receiving at least one of a relatively high logic level signal and a relatively low logic level signal from an external source, and having an output connected to the enable input of the memory device, and having a programming input connected to a programming control signal source; and
programmable means in said enabling circuit for causing the enabling circuit to provide the enabling signal to the enabling input in response to a selected one of said relatively high and said relatively low logic level signals.

16. A field programmable memory device according to claim 15, wherein said programmable means comprises a logic element having a first input connected to the input pin of the memory device, a second input connected to a reference voltage by a programmable element, and means for programming said programmable element.

17. A field programmable memory device according to claim 16, wherein said means for programming said programmable element comprises an inverter having an input connected to the programmable element and having an output, and a NAND gate having a first input connected to the output of the inverter, a second input connected to the programming input, and an output connected to the programmable element.

18. A field programmable memory device according to claim 16, wherein said logic element is an Exclusive OR gate.

19. A programmable chip enable for an integrated circuit, comprising:
an input for receiving at least one of a relatively high logic level signal and a relatively low logic level signal from an external source; and
programmable circuit means, connected to said input, for enabling the integrated circuit in response to a selected one of said relatively high and said relatively low logic level signals received at said input;
wherein said programmable circuit means comprises a logic element having a first input connected to said input for receiving logic level signals from said external source, a second input connected to a reference voltage by a programmable element, and means for programming said programmable element; and
wherein said means for programming said programmable element comprises an inverter having an input connected to the programmable element and having an output, and a NAND gate having a first input connected to the output of the inverter, a second input connected to a programming control signal source, and an output connected to the programmable element.

20. A field programmable memory device comprising:
an array of memory elements;
a plurality of inputs and outputs for accessing the memory elements;
an input for receiving at least one of a relatively high logic level signal and a relatively low logic level signal from an external source; and
programmable circuit means, connected to said input for receiving logic level signals, for enabling the memory device in response to a selected one of said relatively high and said relatively low logic level signals received at said input;
wherein said programmable circuit means comprises a logic element having a first input connected to said input for receiving logic level signals from an external source, a second input connected to a reference voltage by a programmable element, and means for programming said programmable element; and wherein said means for programming said programmable element comprises an inverter having an input connected to the programmable element and having an output, and a NAND gate having a first input connected to the output of the inverter, a second input connected to a programming control signal source, and an output connected to the programmable element.

21. A field programmable memory device having a programmable chip enable, comprising:
an array of memory elements;
a plurality of inputs and outputs for accessing the memory elements;
an enable input for receiving at least one of a relatively high logic level signal and a relatively low logic level signal from an external source; and
programmable circuit means, connected to said enable input for receiving logic level signals, for enabling the memory device to provide access to the memory elements in response to a selected one of said relatively high and said relatively low logic level signals received at said enable input, and for disabling the memory device to prevent access to the memory elements in response to the other of said signals received at the enable input.

* * * * *